United States Patent [19]

Stirn

[11] Patent Number: 4,596,645
[45] Date of Patent: Jun. 24, 1986

[54] REACTIVELY-SPUTTERED ZINC SEMICONDUCTOR FILMS OF HIGH CONDUCTIVITY FOR HETEROJUNCTION DEVICES

[75] Inventor: Richard J. Stirn, Diamond Bar, Calif.

[73] Assignee: California Institute of Technology, Pasadena, Calif.

[21] Appl. No.: 663,768

[22] Filed: Oct. 23, 1984

[51] Int. Cl.$^4$ ............................................. C23C 15/00
[52] U.S. Cl. .......................... 204/192 S; 204/192 SP; 427/38; 427/86
[58] Field of Search ............ 204/192 R, 192 S, 192 C, 204/192 P; 427/38, 39, 85, 86

[56] References Cited

U.S. PATENT DOCUMENTS

| 3,522,164 | 7/1970 | Sumner | 204/192 S |
| 4,013,533 | 3/1977 | Cohen-Solal et al. | 204/192 S |
| 4,025,339 | 5/1977 | Kuehnle | 204/192 S |
| 4,464,415 | 8/1984 | Yamazaki | 427/39 |
| 4,515,668 | 5/1985 | Brownell et al. | 204/192 S |

FOREIGN PATENT DOCUMENTS 2111534  7/1983  United Kingdom ............ 204/192 S

OTHER PUBLICATIONS

Jonath et al, "Copper Sulfide Films Deposited by Cylindrical Magnetron Reactive Sputtering," J. Vac. Sci. Technol., 16(2), Mar./Apr. 1979.
Thornton et al, "Indium Doped Cadmium Sulfide Films Deposited by Cylindrical Magnetron Reactive Sputtering," J. Vac. Sci. Technol., 18(2), Mar. 1981.
Thornton et al, "Reactive Sputtered Copper Indium Diselenide Films for Photovoltaic Applications," J. Vac. Sci. Technol. A2(2), Apr.-Jun. 1984.

Primary Examiner—John F. Niebling
Assistant Examiner—Terryence Chapman
Attorney, Agent, or Firm—Freilich, Hornbaker, Rosen & Fernandez

[57] ABSTRACT

A high conductivity, n-doped semiconductor film is produced from zinc, or Zn and Cd, and group VI elements selected from Se, S and Te in a reactive magnetron sputtering system having a chamber with one or two targets, a substrate holder, means for heating the substrate holder, and an electric field for ionizing gases in the chamber. Zinc or a compound of Zn and Cd is placed in the position of one of the two targets and doping material in the position of the other of the two targets. Zn and Cd may be placed in separate targets while a dopant is placed in the third target. Another possibility is to place an alloy of Zn and dopant, or Zn, Cd and dopant in one target, thus using only one target. A flow of the inert gas is ionized and directed toward said targets, while a flow of a reactant gas consisting of hydrides of the group VI elements is directed toward a substrate on the holder. The targets are biased to attract negatively ionized inert gas. The desired stochiometry for high conductivity is achieved by controlling the temperature of the substrate, and partial pressures of the gases, and the target power and total pressure of the gases in the chamber.

16 Claims, 4 Drawing Figures

REACTIVELY-SPUTTERED ZINC SEMICONDUCTOR FILMS OF HIGH CONDUCTIVITY FOR HETEROJUNCTION DEVICES

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to high conductivity semiconductor films and more particularly to II-VI reactively sputtered films using Zn as at least one of the group II elements and any one or more elements selected from group VI.

There has been some research on sputter deposition of semiconductor materials, such as CdS, $CuInSe_2$, $Cu_2S$, using magnetron sputtering techniques. Sputtering offers great promise for films deposited over large areas from which heterojunction solar cells of high efficiency may be fabricated. However, a significant problem experienced is sufficient reduction of the resistivity of the sputtered film for use in device application. Unless sufficiently low resistivity films can be produced, the material is not suitable for solar cells, for example, because the $I^2R$ losses in the material limit the solar cell panel efficiency.

Zinc selenide (ZnSe) would be an interesting semiconductor for heterojunction solar cells, and light emitting diodes because of its high bandgap (2.67 eV), lattice constant (5.6687Å), thermal expansion coefficient ($7 \times 10^{-6}°C.^{-1}$), and electron affinity (4.09 eV). However, when deposited as a thin film by a variety of techniques, ZnSe is usually too resistive for practical use in a solar cell without the impractical step of annealing in excess Zn vapor for many hours, or even days. For example, the application of ZnSe films to photovoltaics recently has included $Zn_3P_2$ thin films as the photon absorber, using the vacuum evaporation of ZnSe, treated to have excess Zn, and a dopant such as Ga or In. Deposited ZnSe films not treated to have excess zinc have lateral resistivities of $10^8$ ohm-cm or more. Films doped with Ga, but not In, could have this resistivity lowered to slightly less than 1 ohm-cm only by annealing in excess zinc using a Zn vapor at 500° C. for 24 hours.

Complimentary research has used close-spaced vapor transport in the presence of hydrogen for ZnSe deposition. The source material is ZnSe powder, sometimes including pure Al, and a separate Zn source placed in the reaction tube. However, deposited films not further treated had resistivities above $10^5$ ohm-cm, and annealing the films of ZnSe:Al in Zn vapor only brought the resistivity down to 800 ohm-cm at its lowest. Co-evaporation of Zn and Se with dopants has also been attempted without better results.

It is necessary to obtain low-resistivity films for heterojunction device application in order to develop a higher built-in potential at the junction, and to minimize series resistance and poor contact effects. For photovoltaic devices, the ZnSe resistivity should be 10 ohm-cm or even less ($n \approx 10^{16} cm^{-3}$).

The primary reason for the difficulty of depositing low resistivity ZnY films, where Y is a selected group VI element such as S, Se or Te, is the strong tendency for autocompensation of shallow donor impurities by zinc vacancies. If the density of these excess vacancies can be minimized during growth, such as by maintaining near-perfect stoichiometry, or even Zn-rich conditions within the crystalline grains, controlled doping by Al, Ga, or In should be feasible.

Thin films of ZnSe have been deposited by: close-spaced vapor transport; organo-metallic chemical vapor deposition (OM-CVD); liquid phase epitaxy (LPE); molecular beam epitaxy (MBE); vacuum evaporation of the compound (VEC); and rf sputtering of the compound. In most cases, deposited films not further treated have resistivities of $10^4$–$10^8$ ohm-cm, except where GaAs substrates are used at relatively high deposition temperatures. In those cases, out-diffusion of Ga from the GaAs substrates is probably the cause of resistivities as low as 0.05 ohm-cm.

It would be desirable for solar cell application to deposit doped ZnSe films on a substrate that will serve as the window to the solar energy, for example, glass. The resistivity of such a doped film can be lowered by subsequent annealing in excess Zn vapor. However, an annealing process is unacceptable for solar cell fabrication for reasons of cost, and also unacceptable in the case of ZnSe deposited on semiconductors such as GaAs, Ge, $Zn_3P_2$ or CdTe for other device structures because of degradation of the heterojunction.

As is the case for many high bandgap II-VI compounds, it is suspected that the high resistivity of a zinc compound (typically $10^6$–$10^8$ ohm-cm) is caused by excess Zn vacancies compensating donor impurities. Consequently, an object of this invention is to deposit lower resistivity zinc semiconductor films by reactive dc magnetron sputtering of Zn in a gaseous mixture of a group VI hydride, such as $H_2Se$, and an inert element, such as Ar, using a suitable dopant, such as In.

SUMMARY OF THE INVENTION

In accordance with the present invention, deposition and impurity doping of ZnY, where Y is any one or two group-VI elements, such as S, Se or Te, is carried out in a reactive dc magnetron sputter deposition system, whereby Zn metal is sputtered in a gaseous mixture of a hydride of the selected group-VI element, or elements, and an inert element, such as argon, and the impurity, such as In, is co-sputtered from a second target, or alloyed with the Zn. The Zn to group-VI element ratio can be closely controlled by the partial pressure of the reactive gas, substrate temperature, Zn target power and total gas pressure (i.e., Zn sputtering rate), and substrate biasing. Shallow-level dopants, which would be less compensated with a reduced Zn vacancy concentration, can be introduced by co-sputtering a separate target, or by incorporation of the dopant in the Zn sputter target.

DESCRIPTION OF PREFERRED EMBODIMENTS

Figure 1:
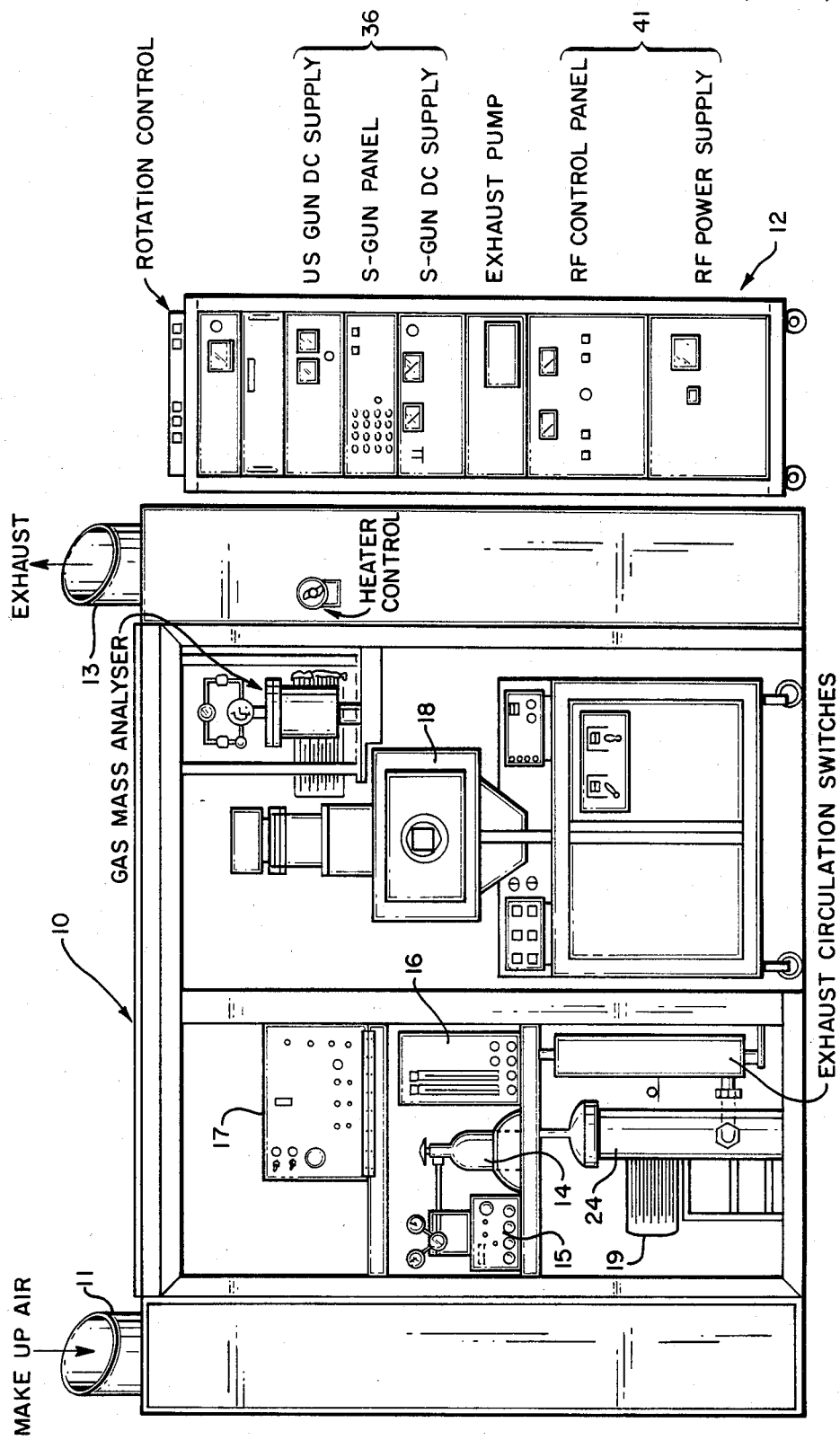
FIG. 1 is a diagram illustrating a sputter deposition system, the operative portion of which is the sputtering chamber.

Referring to FIG. 1, a typical or conventional sputter deposition system, modified to handle group-VI hydride gases, is used to deposit indium-doped ZnSe, for example. Since the group-VI hydrides are toxic, the entire system is sealed in an enclosure 10. Makeup air enters through a duct 11, passes through the sealed enclosure 10 containing all components, except a control rack panel 12, and out an exhaust duct 13. From the exhaust duct, the air passes through a scrubber (not shown) where any of the toxic gases that may have leaked out of the system into the enclosure 10 are neutralized by NaOH.

The toxic gas is $H_2Se$ for the example of depositing ZnSe. It is contained in a bottle 14 positioned between the gas flow control 15 for the system and flowmeters 16. Above the $H_2Se$ bottle is a control panel 17 for regulating the partial pressure ratio of the $H_2Se$ and an inert gas (Ar, Kr, Xe or Ne) in the sputtering chamber 18. The dc power to the sputtering chamber, bias voltage of the substrate (if desired), rotational speed control of the substrate, and total gas pressure (1–10 milliTorr) are all controlled from the rack panel 12.

Figures 3A, 3B:
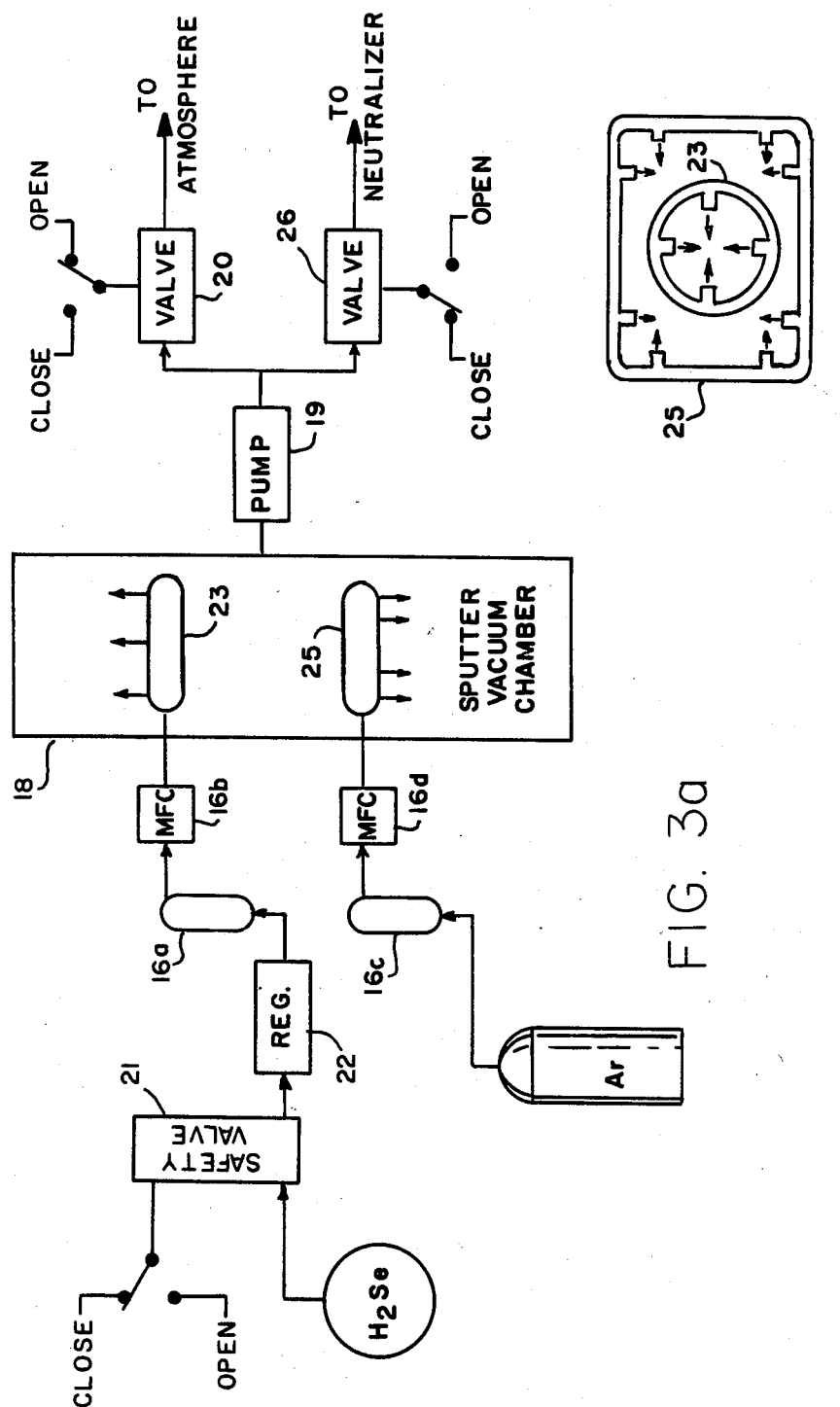
FIG. 3a is a flow chart for the gases in the system of FIG. 1.
FIG. 3b is a schematic diagram illustrating the manner in which the reactive gas and inert gas manifolds are positioned relative to the substrate and the target, respectively.

The sputter deposition system modified for the process of this invention consisted of a research-type S-Gun sputter deposition system. The targets are cylindrical and not very large as compared to production-type sputter deposition systems, where the targets are generally rectangular. However, except for size and shape, the principles of operation are the same so that the teachings of the present invention may be carried over to commercial production of film of ZnSe or other Zn and Group-IV element. A roughing pump 19 with an air purifier is provided for the inert gas, and provision is made for automatic shut off of the toxic gas flow should there not be a negative pressure differential in the sealed enclosure 10, or in a case of total power failure. FIG. 3a illustrates details of the flow control system.

A pump exhaust bypass valve 20 to the atmosphere shown in FIG. 3a is for purposes of initial rough pumping to avoid back flow of the NaOH from the scrubber into the roughing pump 19. The roughing pump cannot be used when a solenoid valve 21 for the toxic gas ($H_2Se$) is open. A pressure regulator 22 couples the $H_2Se$ bottle 14 to a flowmeter 16a, and a mass flow controller 16b couples the flowmeter 16a to a circular manifold 23 having jets directed upwardly toward the substrate 32 shown in FIG. 2. Similarly, a source of argon 24 is coupled by a flowmeter 16c and mass flow controller 16d to a rectangular manifold 25 over all targets shown in FIG. 2, or a separate circular manifold over each target that is in use with jets directed downwardly toward the target. In commercial operation, the flowmeters would be omitted. Once the rough pumping is complete, the bypass valve 20 is closed, a valve 26 to the neutralizer is opened, and then the solenoid valve 21 can be opened to commence operation.

Figure 2:
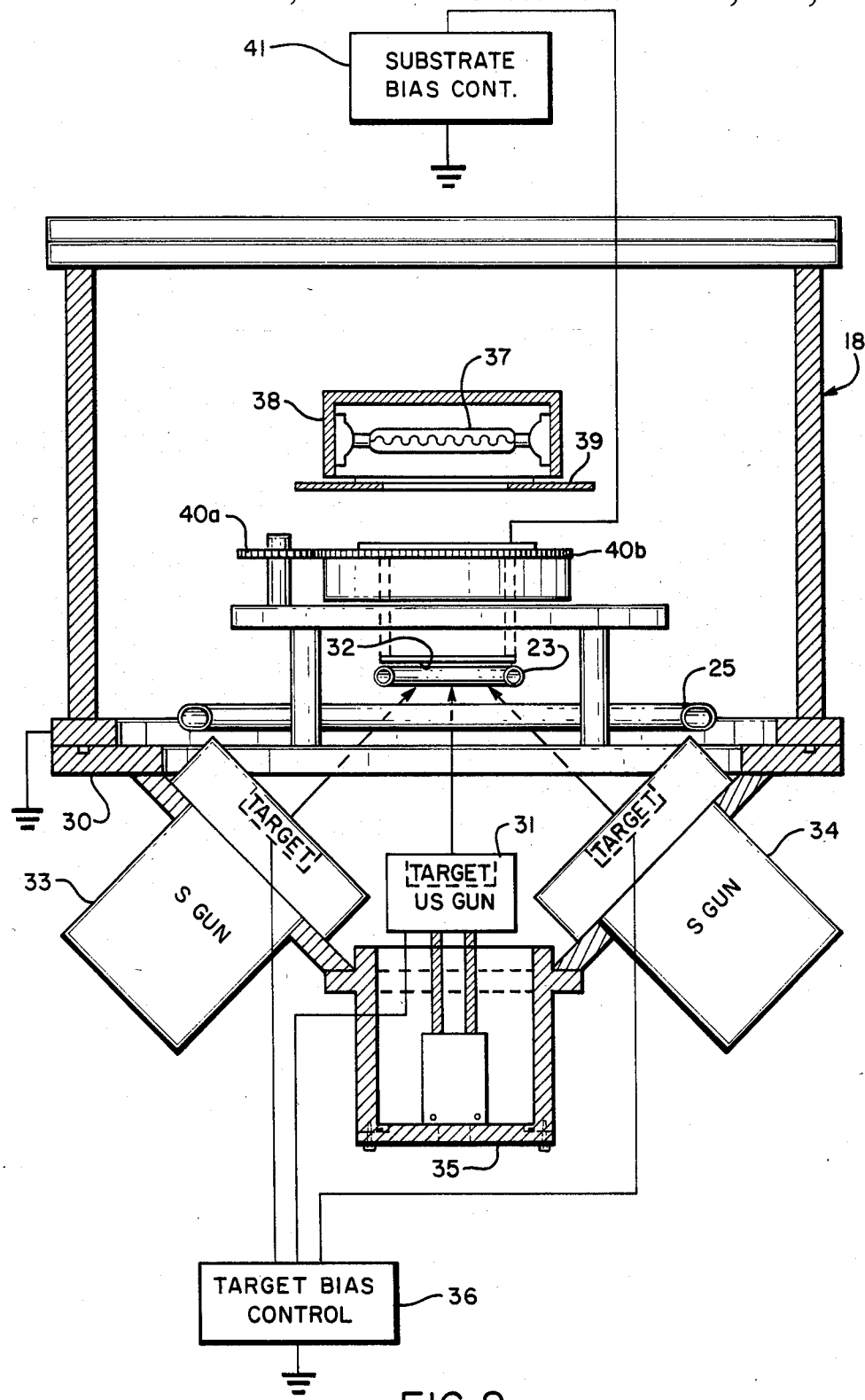
FIG. 2 is a diagram illustrating the arrangement of the sputtering chamber in the system of FIG. 1.

The major modification made to the sputter chamber 18 available from Sputtered Films, Inc. shown in FIG. 2 is in its base plate 30. The original base plate had three research S-Guns mounted with their sputtering axis vertical. That was not suitable for co-sputtering zinc and indium, or zinc and some other group II element, for deposition of ternary compounds, such as doped $Zn_{1-x}Cd_xY$, where Y is Se, S and/or Te. The modification was to reshape the base plate so there is one sputtering gun 31 mounted with a vertical sputtering axis directly below the center of a substrate holder 32, and two S-Guns, 33 and 34, one on each side, each having its sputtering axis at an angle from the vertical and pointing at the center of the substrate holder 32, as shown in FIG. 2. Each of the S-Guns 33 and 34 uses a cylindrical two-inch diameter target, which is nearly one-half inch thick. The center gun is of a research type known as US Gun. It too has a two-inch diameter cylindrical target, but only one-eighth inch thick. Target replacement is more difficult in the US Gun, so a removable plate 35 was provided for demounting the entire US Gun. The S-Guns 33 and 34 are accessible from the top to replace the targets while the guns remain in place.

In operation, the sputtering chamber 18 receives the reactive gas, such as $H_2Se$, through the safety valve 21 and regulator 22 while argon is separately introduced into the chamber. The mass flow controller in the path of each gas controls the partial pressure ratio of the reactive gas and the inert gas. The pump 19 exhausts the chamber to the neutralizer in the scrubber.

An electric field in the sputtering chamber ionizes the gases, primarily to produce Ar ions that are attracted to the properly biased target mounted on the S-Gun. This electric field is achieved in the conventional manner of grounding the chamber and applying a bias voltage to the back of the targets through a bias control unit 36 located on rack panel 12. Separate bias voltage control is provided for each target. A permanent toroid magnet is provided around the target in each S-gun to confine the glow discharges, hence the term "reactive dc magnetron sputtering" of Zn in a controlled gaseous mixture.

To introduce the dopant such as indium or aluminum, a target of selected metal is mounted on another gun. For a ternary semiconductor with two group II elements, a third target may be mounted in a third gun. Argon ions striking those targets cause sputtering of the target material onto the substrate affixed to the substrate holder. The dopant can also be readily introduced by alloying the dopant with zinc in the main target, or with the second target in case of a ternary semiconductor such as with Cd in the case of $Zn_{1-x}Cd_xSe$.

Temperature of the substrate is controlled during this process by a heating element 37 in a shielding cup 38 which heats the substrate by radiant heating of the substrate holder through the center of an annular shield 39 that protects rotating gears for the substrate holder from radiant heat. Optimum temperature appears to be approximately 150° C. A drive gear 40a continually rotates the substrate holder 32 through a driven gear 40b so that the substrate affixed to its underside is deposited uniformly with sputtered material.

From the foregoing it is readily appreciated that a modified magnetron sputter facility built around an existing research S-Gun system manufactured by Sputtered Films, Inc., provides for up to three metallic targets to be safely sputtered in environments of reactive gases, such as $H_2Se$, $H_2S$, $H_2Te$, for deposition of doped binary or ternary semiconductors. A rotating substrate holder designed for accommodating up to $2'' \times 2''$ substrates can be heated to 450° C. The rotational capability is crucial for obtaining compositional uniformity for co-sputtered materials, and to a lesser degree, for the reactive species. The argon gas, and the $H_2Se$ gas used for ZnSe deposition, are preferably introduced to the system through separate manifolds using mass flow control. In that way, the H$_2$Se gas at the proper partial pressure can be directed toward the substrate, thereby to enhance ZnSe deposition on the substrate and to minimize compound formation on the target(s), while the base sputtering gas, argon, is directed toward the magnetron targets.

The Zn to Se ratio can be controlled by the partial pressure of H$_2$Se, substrate temperature, the Zn target power and total gas pressure (i.e., the sputter rate), and negative substrate biasing, which may be an rf bias provided by a control unit 41 on the rack panel 12 to the substrate holder to increase deposition of Zn relative to the group VI element(s) for a sputtered film that is more zinc rich. To be able to provide such a substrate bias, the substrate holder is electrically isolated from the sputtering chamber. That requires the drive gear 40 to be made of ceramic, plastic, or some other dielectric material. Shallow level dopants can be introduced by co-sputtering In or Al metal, or by incorporating Al, Ga or Sn in the Zn sputter target.

As is well recognized by those of ordinary skill in the art of sputtering, there can be considerable stress built into films sputtered on foreign substrates. Such stresses, due to thermal expansion coefficient differences and entrapped gaseous species, can be either compressive or tensile in nature. Tensile stresses are the least desirable since they can lead to film cracking and film separation from the substrate.

It is also well recognized that varying the degree of ion bombardment of the substrate during film growth, either by controlling the sputtering gas pressure or by substrate (negative) biasing, can influence the degree of stress and even change it from tensile to compressive, or vice versa. This effect was observed for the ZnSe films deposited by reactive magnetron sputtering with total Ar+H$_2$Se pressures below about 6 milliTorr leading to compressive stress and total pressure above about 6 milliTorr leading to tensile stress.

What has not been recognized for the case of II-VI semiconducting films, such as ZnSe, is that controlled substrate ion bombardment will also affect the efficacy of the dopant incorporated by means described hereinbefore. This is accomplished by using such ion bombardment intentionally to further control the Zn to Se ratio in order to assure an excess of Zn over Se, or at least a minimum of Zn vacancies. The substrate ion bombardment, which preferentially sputters Se atoms from the growing film (as well as entrapped AR atoms), can be controlled by applying rf bias to the substrate holder or by the use of directed ion beam sources. The substrate holder 32 in FIG. 2 is insulated from the rest of the chamber for purposes of rf biasing, and the well containing the demountable U.S. sputtergun 31 provides space for a 3-cm ion source.

The approach for determining the control parameters necessary in any particular system is to obtain high conductivity ZnSe films by reactively sputtering Zn targets while varying the target power, H$_2$Se flow rate, total gas pressure, substrate temperature, and doping level of In until optimum results are achieved. Corning 7059 glass substrates are preferred for the optimization phase. For practical use in photovoltaics, ZnSe would be deposited on conducting transparent oxide (CTO)-coated glass or on certain semiconductors, such as Zn$_3$P$_2$, CdTe, and CuInSe$_2$.

In practice, the DC target power (about 350 mA @260 volts), has been held constant near the maximum (limited by selenium reaction at the Zn target surface which leads to micro plasmas and discharge instability). Optically high quality ZnSe films can be deposited over a wide range of H$_2$Se flow rates. Apparently excess H$_2$Se is unreacted and is exhausted along with the argon and hydrogen by-product. Larger amounts of H$_2$Se simply lead to greater discharge of unused Se as mentioned above. However, the minimum amount of H$_2$Se should be used, in any case, so as to minimize Zn vacancies which are probably causes of compensation of donor impurities, leading to high resistivities usually observed in ZnSe. When a series of runs were made without any dopants, no noticeable change in resistivity was observed over a factor of thirty in the H$_2$Se flow rate, for a relatively high substrate temperature of 400° C., as shown by the following table.

| Undoped ZnSe Films for Different H$_2$Se Flow Rates (Constant Gas Pressure and Power, T$_{substrate}$ = 400° C.) | | |
|---|---|---|
| Sample | Relative H$_2$Se Flow Rate | Resistivity (ohm-cm) |
| GZ410 | 1 | 3 × 10$^8$ |
| GZ408 | 5 | 3 × 10$^8$ |
| GZ409 | 10 | 3 × 10$^8$ |
| GZ405 | 25 | 3 × 10$^8$ |
| GZ407 | 30 | 3 × 10$^8$ |

There is an indication that at low substrate temperature slightly reduced resistivities are obtained when the Zn to Se ratio is increased.

In order to obtain reasonable conductivities in ZnSe, doping with shallow-level donors is required. A Zn target doped with 1% In was used so that the In content could be held constant while investigating the effects of substrate temperature and H$_2$Se injection rate.

Substrate temperature should have an effect on thin film electrical properties in at least two ways. Lower values should drive ZnSe toward a higher Zn content (desirable) due to the reduced Zn loss from the substrate before reaction with Se. However, higher temperatures will usually improve thin film properties, such as mobility, and reduce film defects and pinholes by inducing larger grain development.

A series of depositions were made using the fixed 1% In-doped Zn target and a fixed H$_2$Se flow rate, but varying the substrate temperature. The argon flow was set to give a chamber pressure of 6 milliTorr for a maximum restriction in the variable orifice next to the turbomolecular pump. The H$_2$Se flow relative to the Ar flow is quite small, about a factor of 130. The following table shows the results of this series of runs.

| In-Doped ZnSe Films for Different Substrate Temperatures (Constant Gas Pressure, Power, and H$_2$Se/Ar Flow Ratio) | | |
|---|---|---|
| Sample | Substrate Temp. (0° C.) | Resistivity (ohm-cm) |
| GZI 430 | 150 | 8 × 10$^2$ |
| GZI 432 | 150 | 1.5 × 10$^4$ |
| GZI 433 | 175 | 1.9 × 10$^5$ |
| GZI 424 | 200 | 1.3 × 10$^6$ |
| GZI 435 | 250 | 8.3 × 10$^7$ |
| GZI 427 | 300 | 8.0 × 10$^7$ |
| GZI 411 | 400 | 3.6 × 10$^8$ |

It can be seen that there is a definite trend toward lower resistivities as the substrate temperature is lowered. The minimum resistivity measured for this series is 800 ohm-cm, although the appearance of that sample was not optically as good as the rest.

The importance of a dopant is shown in the following table for the case of In.

Effect of In on Resistivity in ZnSe Films ($T_{substrate}$ = 150° C., Ar to H$_2$Se Flow Rate = 130)

| Sample | Sputter Target | Resistivity ohm-cm |
| --- | --- | --- |
| GZI 432 | Zn (1% In) | $1.5 \times 10^4$ |
| GZI 442 | Zn | $1.2 \times 10^8$ | where for the same sputtering conditions a substrate temperature of 150° C., a decrease of $10^4$ in resistivity is seen when sputtering a 1% In-doped Zn target as compared to an undoped Zn target. Similarly, the importance of excess Zn compared to Se is shown in the following table.

Effect of H$_2$Se Flow Rate on In Doped ZnSe Resistivity ($T_{substrate}$ = 175° C., Constant Power)

| Sample | Ar to H$_2$Se Flow Rate | Total Pressure (m Torr) | Resistivity (ohm-cm) |
| --- | --- | --- | --- |
| GZI 433 | 130 | 6.5 | $1.9 \times 10^5$ |
| GZI 434 | 4.3 | 7.5 | $1.1 \times 10^8$ | where for a substrate temperature of 175° C., a decrease of $10^3$ in resistivity is seen when decreasing the H$_2$Se flow rate by a factor of thirty.

Resistivities are determined by evaporating Au contacts in a configuration that measures sheet resistance, and by measuring the film thickness by profilometry (typically about 5000–6000 Å).

The effect of using conducting transparent oxide (CTO)-coated glass substrates was investigated. At substrate temperatures over 250° C., the SnO$_2$ coating changed to a darker appearance. ZnSe films deposited at 200° C. or less seem to have no effect on the SnO$_2$ appearance. Resistivities of the ZnSe films on SnO$_2$ seem to be comparable to those films on bare glass. This observation was made by measuring the total resistance between two contacts as used for sheet resistance measurements, but with the current path perpendicular to the plane of the film and through the sheet resistance of the SnO$_2$ coating (measured separately).

The optimum operating parameters for the system described is 20° C., argon pressure at 6 milliTorr and H$_2$Se injected at 3.6 sccm flow rate. Power applied to the Zn target is approximately to 70 to 80 watts, controlled to hold a fixed Zn flux rate. Power applied to the In target is the principal parameter for control of ZnSe resistivity, as shown by the following table.

Dependence of ZnSe Resistivity on In Flux Rate

| Sample | Relative DC Power to In Target | Thickness (Å) | Resistivity (ohm-cm) |
| --- | --- | --- | --- |
| 489 | 0 | 1800 | $10^9$ |
| 498 | 260 | 2500 | $3.3 \times 10^7$ |
| 500 | 314 | 3500 | $2.5 \times 10^6$ |
| 499 | 336 | 3300 | $8.3 \times 10^4$ |
| 502 | 401 | 2800 | 225 |
| 505 | 420 | 4200 | 80 |
| 504 | 453 | 4500 | 96 |

It should be noted that all parameters, except that of substrate temperature, are highly dependent on the particular sputter guns, pumps, chamber size, and geometries of the targets and substrate and their relative positions. Consequently, the following claims are intended to embrace parameters for the particular sputter guns, pumps, etc., used within the true spirit of the present invention.

What is claimed is:

1. A method of producing a zinc rich, high conductivity n-doped semiconductor film from zinc, and a group VI element selected from Se, S and Te, in a reactive magnetron sputtering system utilizing an inert gas, said system having a chamber with at least two targets, a substrate holder, means for heating said substrate holder, and an electric field for ionizing a gas in said chamber, comprising the steps of placing zinc in the position of one of said two targets and doping material in the position of the other of said two targets, placing a substrate on said holder, maintaining said chamber at a low operating pressure of 1–10 millitorr while introducing into said chamber a flow of said inert gas in a stream directed toward said targets and introducing into said chamber near said substrate a flow of a reactant gas consisting of a hydride of said group VI element directed toward said substrate, ionizing said inert gas, and biasing said targets to attract negatively ionized inert gas, and controlling the ratio of zinc to said group VI element in said semiconductor film by controls of the temperature of said substrate, the partial pressures of said gases, the zinc target power, and total pressure of said gases in said chamber.

2. A method as defined in claim 1 wherein said gas consisting of said hydride of said group VI element is H$_2$Se.

3. A method as defined in claim 1 wherein said dopant material is selected from a group consisting of Al, Ga or In.

4. A method as defined in claim 3 wherein said gas consisting of said hydride of said group VI element is H$_2$Se.

5. A method of producing a high conductivity n-doped semiconductor film from two elements including zinc, and a group VI element selected from Se, S and Te, in a reactive magnetron sputtering system utilizing an inert gas, said system having a chamber with at least two targets, a substrate holder, means for heating said substrate holder, and an electric field for ionizing gases in said chamber, comprising the steps of placing said two elements in the position of one of said two targets and doping material in the position of the other of said two targets, placing a substrate on said holder, maintaining said chamber at low operating pressure of 1–10 millitorr while introducing into said chamber a flow of said inert gas in a stream directed toward said targets and introducing into said chamber near said substrate a flow of a reactant gas consisting of a hydride of said group VI element directed toward said substrate, ionizing said inert gas, and biasing said targets to attract negatively ionized inert gas, and controlling the ratio of said two elements to said group VI element in said semiconductor film by control of the temperature of said substrate, the partial pressures of said gases, the target power of said elements in said one target position, and total pressure of said gases in said chamber.

6. A method as defined in claim 5 wherein said gas consisting of hydride of said group VI element is $H_2Se$.

7. A method as defined in claim 6 wherein said gas consisting of said hydride of said group VI element is $H_2Se$.

8. A method as defined in claim 5 wherein said dopant material is selected from a group consisting of Al, Ga or In.

9. A method of producing a zinc rich high conductivity n-doped semiconductor film from a material comprised of selected group II elements including at least doped zinc and a group VI element selected from Se, S and Te, in a reactive magnetron sputtering system utilizing an inert gas, said system having a chamber with at least one target, a substrate holder, means for heating said substrate holder, and an electric field for ionizing gases in said chamber, comprising the steps of placing said doped zinc in the position of said one target, placing a substrate on said holder, maintaining said chamber at low operating pressure of 1-10 millitorr while introducing into said chamber a flow of said inert gas in a stream directed toward said target and introducing into said chamber near said substrate a flow of a reactant gas consisting of said group VI element, and biasing said target to attract negatively ionized inert gas, and controlling the ratio of doped zinc to said group VI element in said semiconductor film by control of the temperature of said substrate, and partial pressures of said gases, and the target power and total pressure of said gases in said chamber.

10. A method as defined in claim 9 wherein said gas consisting of said hydride of said group VI element is $H_2Se$.

11. A method as defined in claim 9 wherein said dopant material is selected from a group consisting of Al, Ga or In.

12. A method as defined in claim 11 wherein said gas consisting of said hydride of said group VI element is $H_2Se$.

13. A method of producing a zinc rich high conductivity n-doped semiconductor film from a compound material comprised of selected group II elements including at least zinc, and material selected from group VI elements selected from Se, S and Te, in a reactive magnetron sputtering system utilizing an inert gas, said system having a chamber with at least two targets, a substrate holder, means for heating said substrate holder, and an electric field for ionizing gases in said chamber, comprising the steps of placing said group II compound material in the position of one of said two targets and doping material in the position of the other of said two targets, placing a substrate on said holder, maintaining said chamber at low operating pressure of 1-10 millitorr while introducing into said chamber a flow of said inert gas in a stream directed toward said targets and introducing said chamber near said substrate a flow of a reactant gas consisting of hydrides of said selected group VI elements, and biasing said targets to attract negatively ionized inert gas, and controlling the ratio of target material to said group VI element in said semiconductor film by control of the temperature of said substrate, the partial pressures of said gases, and the target power and total pressure of said gases in said chamber.

14. A method as defined in claim 13 wherein said group VI element selected is zinc rich Se.

15. A method of producing a zinc rich high conductivity n-doped semiconductor film from a compound target material comprised of selected group II elements including at least zinc and a dopant, and material selected from a group of VI elements consisting of Se, S and Te, in a reactive magnetron sputtering system utilizing an inert gas, said system having a chamber with at least one target, a substrate holder, means for heating said substrate holder, and an electric field for ionizing gases in said chamber, comprising the steps of placing said target material in the position of said one target and placing a substrate on said holder, maintaining said chamber at a low pressure of 1-10 millitorr while introducing into said chamber a flow of said inert gas in a stream directed toward said target and introducing into said chamber near said substrate a flow of a reactant gases consisting of hydrides of said selected group VI elements, biasing said target to atrract negatively ionized inert gas, and controlling the ratio of target material to said group VI element in said semiconductor film by control of the temperature of said substrate, the partial pressures of said gases, and the target power and total pressure of said gases in said chamber.

16. A method as defined in claim 14 wherein said group VI element selected is Se.

* * * * *